(12) United States Patent
Fritzsche

(10) Patent No.: US 7,099,791 B2
(45) Date of Patent: Aug. 29, 2006

(54) SYSTEM AND METHOD FOR LINKING AND LOADING COMPILED PATTERN DATA

(75) Inventor: William A. Fritzsche, Morgan Hill, CA (US)

(73) Assignee: Credence Systems Corporation, Milpitas, CA (US)

( * ) Notice: Subject to any disclaimer, the term of this patent is extended or adjusted under 35 U.S.C. 154(b) by 57 days.

(21) Appl. No.: 10/960,532

(22) Filed: Oct. 7, 2004

(65) Prior Publication Data
US 2005/0261858 A1   Nov. 24, 2005

Related U.S. Application Data

(63) Continuation-in-part of application No. 10/851,455, filed on May 21, 2004.

(51) Int. Cl.
*G01R 27/28* (2006.01)
*G06F 9/44* (2006.01)

(52) U.S. Cl. .......... 702/119; 717/162; 717/166
(58) Field of Classification Search .......... 702/119, 702/121, 117; 717/162, 166
See application file for complete search history.

(56) References Cited

U.S. PATENT DOCUMENTS

| 5,481,550 A | * | 1/1996 | Garcia et al. ........ 714/744 |
| 2005/0261857 A1 | | 11/2005 | Jones et al. | |

* cited by examiner

*Primary Examiner*—Bryan Bui
*Assistant Examiner*—Meagan S Walling

(57) ABSTRACT

A method for linking compiled pattern data and loading the data into tester hardware includes the steps of generating a composite object that includes a shared resource, determining a local shared resource specific to a test instrument that is associated with the shared resource in the composite object, assigning a local reconciled value or address to the local shared resource, and loading the local shared resource into the test instrument.

15 Claims, 9 Drawing Sheets

| GLOBAL VTS LISTING | INSTRUMENT 1 LOCAL VTS LISTING | INSTRUMENT 2 LOCAL VTS LISTING | INSTRUMENT 3 LOCAL VTS LISTING | INSTRUMENT 4 LOCAL VTS LISTING |
|---|---|---|---|---|
| VTS A 10 | VTS A1 | VTS B2 | VTS A3 | VTS B4 |
| VTS B 12 | VTS A1 | VTS C2 | VTS B3 | VTS C4 |
| VTS C 14 | VTS B1 | VTS C2 | VTS B3 | VTS D4 |
| VTS D 16 | VTS C1 | VTS D2 | VTS C3 | VTS E4 |

FIG. 7

SYSTEM AND METHOD FOR LINKING AND LOADING COMPILED PATTERN DATA

CROSS-REFERENCE TO RELATED APPLICATION

This application is a continuation-in-part of patent application Ser. No. 10/851,455, titled, "System and Method for Linking and Loading Compiled Pattern Data," filed May 21, 2004. The subject matter of this related application is hereby incorporated by reference.

FIELD OF THE INVENTION

The present invention generally relates to automated test equipment for testing electronic devices, such as integrated circuits, and more specifically to a system and method for linking and loading compiled pattern data.

BACKGROUND

In one approach of using automated test equipment to test an electronic device, such as an integrated circuit, various test instruments transmit data to the electronic device to stimulate the device. In response, the electronic device produces response data, which is monitored by the automated test equipment. The automated test equipment then compares this response data to reference responses to determine whether the electronic device is functioning as intended. Oftentimes, the data transmitted to the electronic device during testing as well as the reference responses are represented by a series of test vectors (where test vectors represent raw data delivered to pins of an electronic device during testing) included in one or more test patterns (the source code versions of these test patterns are referred to herein as "pattern sources"). A test pattern usually exists for testing each mode of operation of each module in the electronic device. Therefore, thousands of test patterns may be used, in different combinations, to test the various aspects of an electronic device.

Before loading a test pattern into the test equipment, the pattern source is compiled into object code, which the test equipment is configured to execute. When compiling a particular pattern source, the compiler assigns specific values or addresses to certain data in the pattern source (referred to herein as "shared resources") that the test equipment is configured to recognize. As persons skilled in the art will understand, if two or more pattern sources are compiled independently of one another, then the compiler may assign the same value or address to two different shared resources that reside in different pattern sources. To avoid this problem, current systems implement one of two approaches when compiling and loading a combination of two or more test patterns used to implement a particular test on an electronic device.

The first approach entails individually compiling each test pattern and then, one test pattern at a time, loading a given compiled test pattern into the test equipment and executing that test pattern on the electronic device. A major drawback of this approach is that it does not allow multiple compiled test patterns to be loaded into the test equipment simultaneously and then executed. This approach is therefore quite time consuming.

The second approach entails creating a group of pattern sources and then compiling the group as a whole. This approach allows the compiler to compile the different pattern sources relative to one another so that the compiler does not assign the same value or address to any two different shared resources in the group of pattern sources. A major drawback of this approach is that the pattern sources need to be recompiled every time a new group of test patterns is created for testing purposes. Similarly, with this approach, every time a change is made to a particular test pattern, every group of pattern sources containing that test pattern must be recompiled. Recompiling groups of pattern sources is very inefficient. Further, the compiled test patterns cannot be stored as read-only files since the object code must be changed every time a new group is created or a change is made to a particular test pattern.

SUMMARY

One embodiment of a method for linking and loading compiled pattern data includes the steps of generating a composite object that includes a shared resource, determining a local shared resource specific to a test instrument that is associated with the shared resource in the composite object, assigning a local reconciled value or address to the local shared resource, and loading the local shared resource into the test instrument.

One advantage of the disclosed method is that a composite linker may be configured to perform the method steps to reconcile the values or addresses of shared resources included in a group of pattern objects such that tester hardware does not receive any conflicting values or addresses when the group of pattern objects is loaded into the tester hardware. Having the composite linker perform the reconciliation task using pattern objects, as opposed to having a compiler perform the reconciliation task using pattern sources, enables the pattern sources to be independently compiled to generate the pattern objects, which may then be individually archived as read-only files. This capability, among other things, allows new groups of patterns to be created, linked and loaded into the tester hardware without having to recompile any pattern sources. Similarly, a given pattern source may be modified and recompiled without having to recompile every group of patterns containing that pattern source.

Another advantage is that shared resources may be remapped on an instrument-by-instrument basis to overcome loading limitations that may exist in the tester hardware.

BRIEF DESCRIPTION OF THE DRAWINGS

FIG. 7 is a conceptual mapping of the different VTSs in the VTS load element of FIG. 3 to the instruments of the tester hardware, according to an alternative embodiment of the invention;

DETAILED DESCRIPTION

Figure 1:
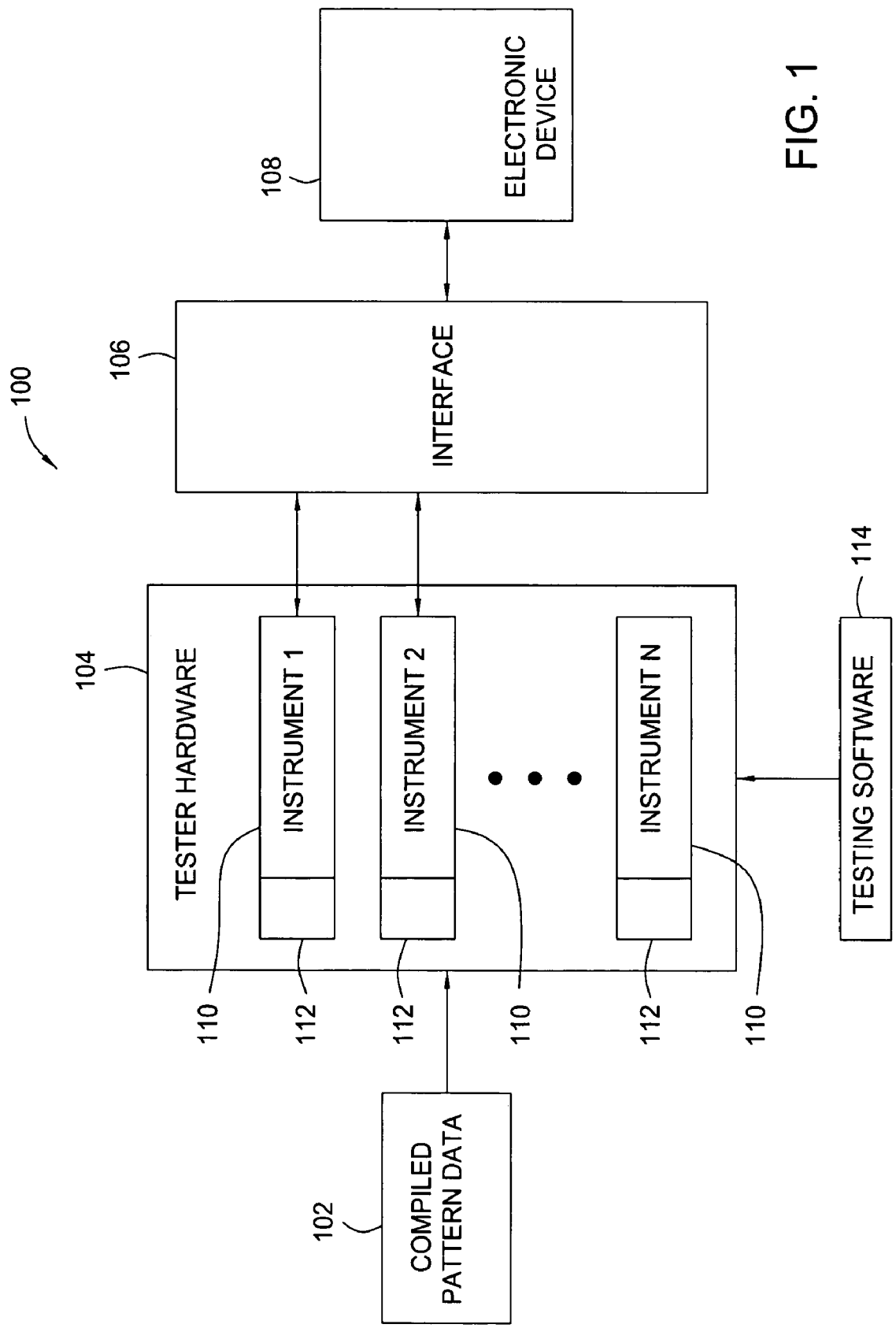
FIG. 1 is a conceptual block diagram illustrating a system for testing an electronic device, according to one embodiment of the invention.

FIG. 1 is a conceptual block diagram illustrating a system 100 for testing an electronic device 108, according to one embodiment of the invention. As shown, system 100 may include, without limitation, tester hardware 104 and an interface 106. During testing, tester hardware 104 is configured to generate and to transmit electrical signals or data signals to electronic device 108 to stimulate electronic device 108. More specifically, tester hardware 104 may include one or more instruments 110, represented in FIG. 1 by instrument 1, instrument 2, up to and including instrument N. Each of instruments 110 has a finite number of pins through which it provides data signals to electronic device 108. The type and frequency of the data signals transmitted by a particular one of instruments 110 depends on the type and configuration of that instrument. In response, electronic device 108 generates and transmits resulting electrical signals or data signals back to the various instruments 110 of tester hardware 104, which is further configured to monitor these resulting signals. Typically, the actual responses of electronic device 108 are compared to reference responses to evaluate whether electronic device 108 is functioning as intended. As persons skilled in the art will recognize, this diagnostic technique is sometimes referred to as a stimulation/response-monitoring technique.

Interface 106 is configured to couple tester hardware 104 to electronic device 108. In one embodiment, the pins of each of instruments 110 are connected to interface 106 as are the pins of electronic device 108. Interface 106 is configured to direct the data signals transmitted from the various pins of each of instruments 110 to the appropriate pins of electronic device 108. Similarly, when electronic device 108 produces resulting electrical signals in response to these transmitted data signals, interface 106 is configured to direct the resulting signals from the pins of electronic device 108 to the appropriate pins of each of instruments 110.

As FIG. 1 also shows, compiled pattern data 102 is loaded into tester hardware 104 by a pattern loader (not shown). As explained in further detail below in conjunction with FIG. 2, compiled pattern data 102 includes test vectors, which represent the data signals that tester hardware 104 transmits to electronic device 108 during testing. In one embodiment, each of instruments 110 has a data store memory 112 in which compiled pattern data 102 is stored. In addition, test software 114, comprising one or more test programs, runs on tester hardware 104. Each such test program is used to perform certain types of diagnostic tests on electronic device 108 and is configured to control various parameters of those tests. For example, a given test program used to perform a particular type of diagnostic test may define the order in which the different parts of compiled pattern data 102 are executed for the test, the timing used when executing those different parts of compiled pattern data 102 and how to process the responses of electronic device 108 to the data signals transmitted to electronic device 104 by each of instruments 110 of tester hardware 104 to determine whether electronic device 108 is functioning as intended.

Electronic device 108 may be any of type of packaged or unpackaged integrated circuit. As persons skilled in the art will recognize, electronic device 108 is typically referred to as the device under test (the "DUT").

Figure 2:
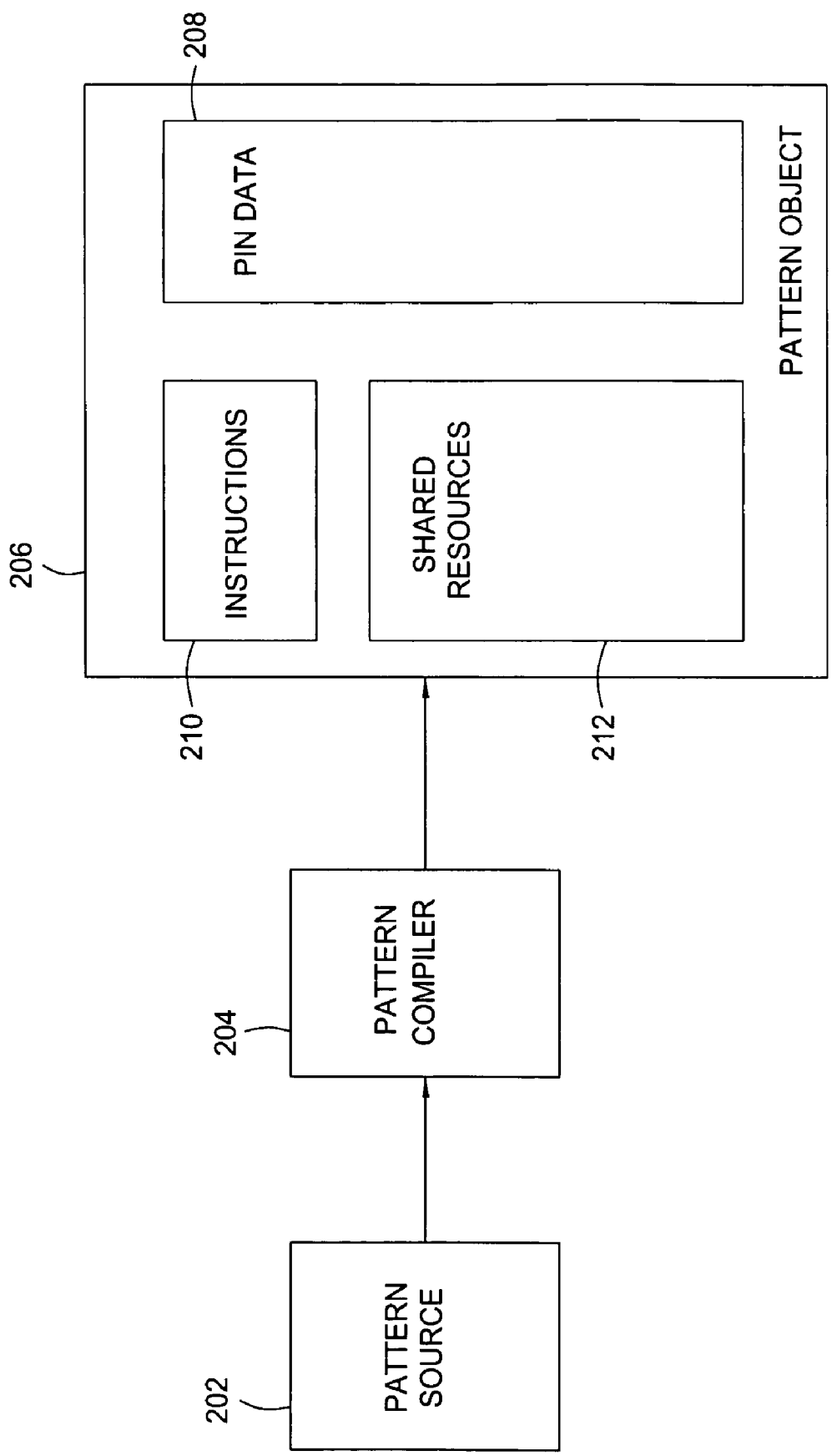
FIG. 2 is a conceptual block diagram illustrating a pattern compiler configured to generate a pattern object from a pattern source, according to one embodiment of the invention.

FIG. 2 is a conceptual block diagram illustrating a pattern compiler 204 configured to generate a pattern object 206 from a pattern source 202, according to one embodiment of the invention. Pattern source 202 is written in source code and includes, without limitation, a file of test vectors, other types of data referred to as shared resources and instructions (also referred to as "op-codes") necessary to synchronize and to deliver the test vectors to electronic device 108 of FIG. 1 during testing. In one embodiment, pattern source 202 is written in American Standard Code of Information Interchange (ASCII). As is commonly known, a different pattern source 202 typically exists for each mode of operation of each module (e.g., memory interfaces, instruction caches, data caches, arithmetic logic unit, cache managers, peripheral interfaces, floating point engine(s), etc.) of electronic device 108 being tested. As electronic device 108 may include hundreds of modules, each having multiple modes of operation, upwards of ten thousand or more different pattern sources may be required to test electronic device 108.

Each test vector of pattern source 202 represents the raw data delivered to the individual pins of electronic device 108 at each time interval during testing. Pattern source 202 may include any number of test vectors, but typically includes 10,000 to 100,000 test vectors.

A shared resource may comprise any type of data related to the global synchronization and delivery of raw data across the pins of electronic device 108. Examples of shared resource include, without limitation, subroutines for manipulating the raw data or performing some other computation or function related to delivering the raw data to electronic device 108, source data selects ("SDS") for accessing external (to the pattern) sources of data or control and delivering that data to or effecting the control functions of specific pins of electronic device 108, vector type selects ("VTS") for configuring the pins of electronic device 108 in certain ways to receive various test vectors and synch type selects ("STS") for transmitting signals to various hardware components of tester hardware 104 to synchronize one or more of instruments 110. A finite number of each type of shared resource exists. For example, in one embodiment, there are only 16 different SDSs, approximately 4,000 different VTSs and only 32 different STSs. Similarly, although each may be called hundreds or thousands of times during testing, only a limited number of subroutines typically reside in pattern source 202. Since the instructions included in pattern source 102 reference a given shared resource multiple times to synchronize and deliver the raw data to electronic device 108 during testing, these resources may be thought of as being "shared" by the different test vectors of pattern source 102. Further, as described in further detail below in conjunction with FIG. 3, when executing a group of pattern objects, the shared resources found in those pattern objects may be shared by the various test vectors residing in each of the pattern objects.

Pattern compiler 204 is configured to compile pattern source 202, converting the source code of pattern source 202 into object code to generate pattern object 206. As shown, pattern object 206 includes, without limitation, pin data 208, instructions 210 and shared resources 212. Pin data 208 comprises the test vectors of pattern source 202. Instructions 210 comprise the object code version of the instructions of pattern source 202, and shared resources 212 comprise the object code version of the shared resources of pattern source 202.

Pattern compiler 204 is configured to identify each shared resource in pattern source 202 and to assign a specific value or address to each such shared resource. Each such value or address represents a unique placeholder that pattern compiler 204 assigns to a particular shared resource in pattern source 202. Pattern compiler 204 is further configured to modify the references to shared resources 212 in instructions 210 to reflect the different values and addresses assigned to shared resources 212. In one embodiment, pattern compiler 204 is configured to structure shared resources 212 such that each shared resource is in a format conducive to efficient remapping of the value or address assigned to it by pattern compiler 204 (the remapping process is described in further detail below in conjunction with FIGS. 3 and 4). More specifically, pattern compiler 204 is configured to place each of shared resources 212 within pattern object 206 at elementary CPU boundaries (e.g., 16 bit offsets for 16 bit pointers or 8 bit offsets for 8 bit pointers) to enable a CPU to quickly access each of shared resources 212 for remapping.

In one embodiment, pattern compiler 204 is configured to structure pattern object 206 such that pin data 208, instructions 210 and shared resources 212 are separated from one another. As persons skilled in the art will understand, such a structure allows easier access to each of pin data 208, instructions 210 and shared resources 212 for editing or modifying pattern object 206. Persons skilled in the art will recognize, however, that the particular structure of pattern object 206 in no way limits the scope of the present invention.

Figure 3:
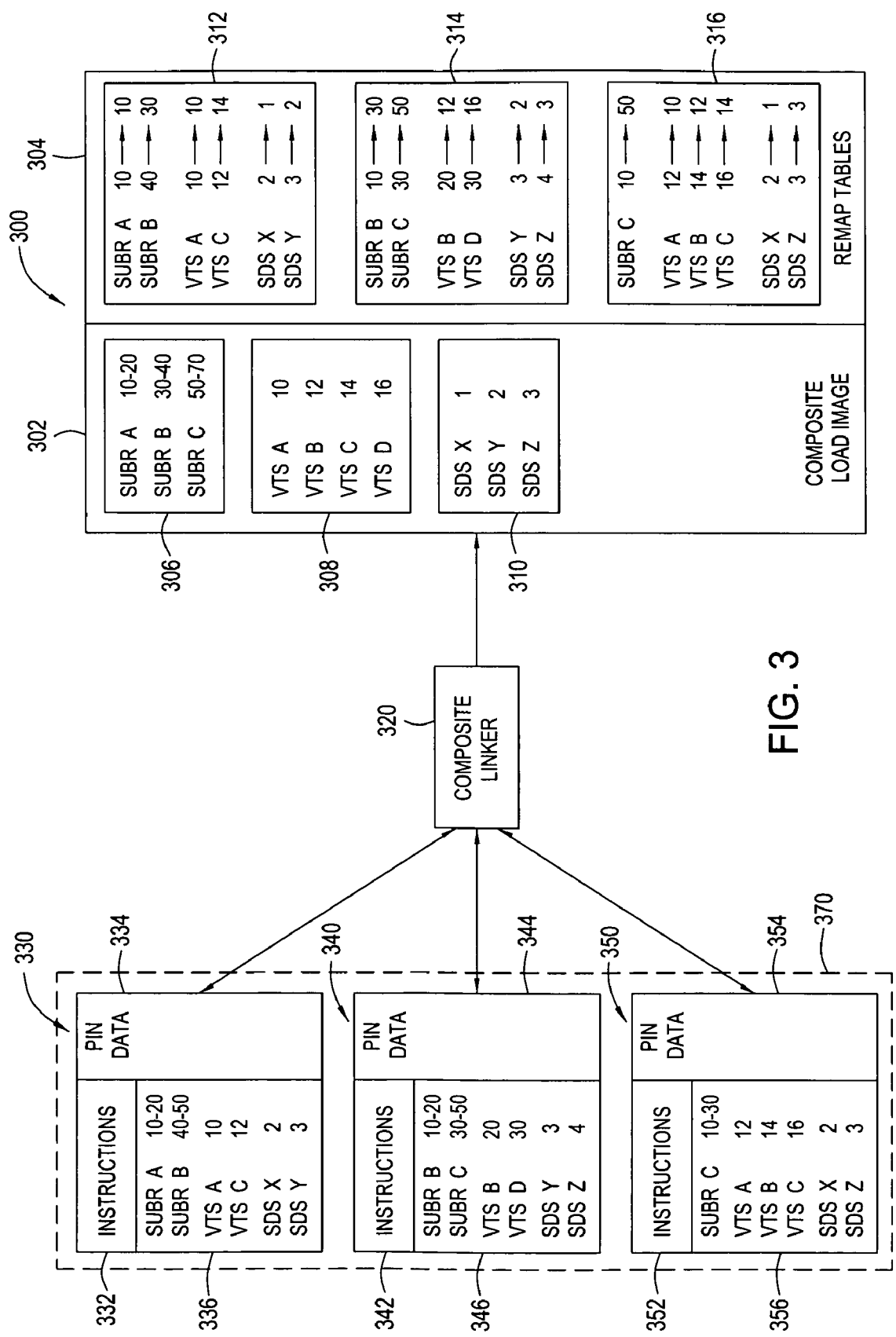
FIG. 3 is a conceptual block diagram illustrating a composite linker configured to generate a composite object for a group of pattern objects, according to one embodiment of the invention.

FIG. 3 is a conceptual block diagram illustrating a composite linker 320 configured to generate a composite object 300 for a group of pattern objects 370, according to one embodiment of the invention. As shown, group of pattern objects 370 includes a first pattern object 330, a second pattern object 340 and a third pattern object 350. Group of pattern objects 370 is created to enable the pattern data of each of first pattern object 330, second pattern object 340 and third pattern object 350 to be linked and loaded, without any temporal breaks, into tester hardware 104 of FIG. 1, as described in further detail herein. Persons skilled in the art will understand that group of pattern objects 370 may include any number of pattern objects and that the use of three pattern objects in FIG. 3 is for illustrative purposes only and in no way limits the scope of the present invention.

As FIG. 3 also shows, first pattern object 330 includes instructions 332, pin data 334 and shared resources 336, second pattern object 340 includes instructions 342, pin data 344 and shared resources 346 and third pattern object 350 includes instructions 352, pin data 354 and shared resources 356. As described above in conjunction with FIG. 2, pattern compiler 204 assigns a value or address to each shared resource in each of first pattern object 330, second pattern object 340 and third pattern object 350. For example, in shared resources 336 of first pattern object 330, subroutine A has been assigned the address of memory space 10–20, subroutine B has been assigned the address of memory space 40–50, VTS A has been assigned a value of 10, VTS C has been assigned a value of 12, SDS X has been assigned a value of 2 and SDS Y has been assigned a value of 3. Similarly, in shared resources 346 of second pattern object 340, subroutine B has been assigned the address of memory space 10–20, subroutine C has been assigned the address of memory space 30–50, VTS B has been assigned a value of 20, VTS D has been assigned a value of 30, SDS Y has been assigned a value of 3 and SDS Z has been assigned a value of 4. Again, in shared resources 356 of third pattern object 350, subroutine C has been assigned the address of memory space 10–30, VTS A has been assigned a value of 12, VTS B has been assigned a value of 14, VTS C has been assigned a value of 16, SDS X has been assigned a value of 2 and SDS Z has been assigned a value of 3.

As the example of FIG. 3 shows, several shared resources have overlapping or conflicting values or addresses. The reason for these overlaps or conflicts is that the pattern source underlying each of first pattern object 330, second pattern object 340 and third pattern object 350 is individually compiled by pattern compiler 204, as described above in conjunction with FIG. 2. Since pattern compiler 204 compiles the pattern sources independently of one another, pattern compiler 204 inevitably assigns overlapping or conflicting values or addresses to the various shared resources of each resulting pattern object. One of the primary purposes of composite linker 320 is to reconcile the values and addresses of the different shared resources across first pattern object 330, second pattern object 340 and third pattern object 350 such that there are no overlaps or conflicts in those values and addresses when the pattern data of group of patterns 370 is loaded into tester hardware 104.

More specifically, composite linker 320 is configured generate composite object 300, which includes, without limitation, a composite load image 302 and a group of remap tables 304. Composite load image 302 includes a binary representation (or other representation, such as a source code representation) of each unique shared resource in group of pattern objects 370 as well as a reconciled value or address for each such shared resource. In generating composite load image 302, pattern linker 320 is configured to step through each pattern object in group of pattern objects 370 (i.e., first pattern object 330, second pattern object 340 and third pattern object), to identify each unique shared resource and the value or address assigned to that shared resource by pattern compiler 204. Pattern linker 320 is further configured to write a binary representation of each unique shared resource to composite load image 302 and assign a new, reconciled value or address to each such shared resource such that none of the values or addresses of any of the unique shared resources conflicts or overlaps with one another.

In one embodiment, composite load image 302 includes a subroutine load element 306, a VTS load element 308 and an SDS load element 310. In one embodiment, subroutine load element 306 contains a binary representation of each unique subroutine included in first pattern object 330, second pattern object 340 and third pattern object 350 of group of pattern objects 370 as well as non-overlapping or conflicting addresses of the memory spaces (within data store memory 112) where those subroutines are to be stored once loaded into tester hardware 104. As shown, composite linker 320 has assigned the address of memory space 10–20 to subroutine A, the address of memory space 30–40 to subroutine B and the address of memory space 50–70 to subroutine C.

In one embodiment, VTS load element 308 contains a binary representation of each unique VTS included in first pattern object 330, second pattern object 340 and third pattern object 350 of group of pattern objects 370 as well as non-overlapping or conflicting values for those VTSs. As shown, composite linker 320 has assigned a value of 10 to VTS A, a value of 12 to VTS B, a value of 14 to VTS C and a value of 16 to VTS D.

In one embodiment, SDS load element 310 contains a binary representation of each unique SDS included in first pattern object 330, second pattern object 340 and third pattern object 350 of group of pattern objects 370 as well as non-overlapping or conflicting values for those SDSs. As shown, composite linker 320 has assigned a value of 1 to SDS X, a value of 2 to SDS Y and a value of 3 to SDS Z.

Group of remap tables 304 includes a remap table for each pattern object in group of pattern objects 370. A remap table is a look-up table that contains a mapping of the values or addresses that pattern compiler 204 assigned to the shared resources included in the pattern object to the reconciled values or addresses that composite linker 320 assigned to those shared resources and reflected in composite load image 302. In one embodiment, as composite linker 320 steps through a particular pattern object in group of pattern objects 370, composite linker 320 is configured to generate a remap table for that pattern object that specifies for each shared resource in the pattern object the mapping of the value or address that pattern compiler 204 assigned to the shared resource to the value or address that composite linker 320 assigned to the shared resource.

Persons skilled in the art will understand that if composite linker 320 determines that a particular shared resource is unique, meaning that composite linker 320 has not yet encountered that shared resource while stepping through the pattern objects of group of pattern objects 370, then composite linker 320 may be configured to include the shared resource and its new, reconciled value or address in composite load image 302, as previously described herein, and to include a remapping of the value or address of the shared resource in the appropriate remap table. However, if composite linker 320 determines that a particular shared resource is not unique, meaning that composite linker 320 has already encountered that shared resource and has already included it and its new, reconciled address in composite load image 302, then composite linker 320 may be configured only to include a remapping of the value or address of the shared resource in the appropriate remap table.

Persons skilled in the art also will understand that, in an alternative embodiment, composite linker 320 may be configured to optimally assign shared resources such that minimal remapping will be required during loading.

In one embodiment, group of remap tables 304 includes a first remap table 312 corresponding to first pattern object 330, a second remap table 314 corresponding to second pattern object 340 and a third remap table 316 corresponding to third pattern object 350. As first remap table 312 shows, subroutine A, subroutine B, VTS A, VTS C, SDS X and SDS Y are the shared resources included in first pattern object 330. As first remap table 312 also shows, pattern compiler 204 assigned the address of memory location 10 to subroutine A and composite linker 320 assigned the reconciled address of memory location 10 to subroutine A, pattern compiler 204 assigned the address of memory location 40 to subroutine B and composite linker 320 assigned the reconciled address of memory location 30 to subroutine B, pattern compiler 204 assigned a value of 10 to VTS A and composite linker 320 assigned a reconciled value of 10 to VTS A, pattern compiler 204 assigned a value of 12 to VTS C and composite linker 320 assigned a reconciled value of 14 to VTS C, pattern compiler 204 assigned a value of 2 to SDS X and composite linker 320 assigned a reconciled value of 1 to SDS X, and pattern compiler 204 assigned a value of 3 to SDS Y and composite linker 320 assigned a reconciled value of 2 to SDS Y.

As second remap table 314 shows, subroutine B, subroutine C, VTS B, VTS D, SDS Y and SDS Z are the shared resources in second pattern object 340. As second remap table 314 also shows, pattern compiler 204 assigned the address of memory location 10 to subroutine B and composite linker 320 assigned the reconciled address of memory location 30 to subroutine B, pattern compiler 204 assigned the address of memory location 30 to subroutine C and composite linker 320 assigned the reconciled address of memory location 50 to subroutine C, pattern compiler 204 assigned a value of 20 to VTS B and composite linker 320 assigned a reconciled value of 12 to VTS B, pattern compiler 204 assigned a value of 30 to VTS D and composite linker 320 assigned a reconciled value of 16 to VTS D, pattern compiler 204 assigned a value of 3 to SDS Y and composite linker 320 assigned a reconciled value of 2 to SDS Y, and pattern compiler 204 assigned a value of 4 to SDS Z and composite linker assigned a reconciled value of 3 to SDS Z.

As third remap table 316 shows, subroutine C, VTS A, VTS B, VTS C, SDS X and SDS Z are the shared resources in third pattern object 350. As third remap table also shows, pattern compiler 204 assigned the address of memory location 10 to subroutine C and composite linker 320 assigned the reconciled address of memory location 50 to subroutine C, pattern compiler 204 assigned a value of 12 to VTS A and composite linker 320 assigned a reconciled value of 10 to VTS A, pattern compiler 204 assigned a value of 14 to VTS B and composite linker 320 assigned a reconciled value of 12 to VTS B, pattern compiler 204 assigned a value of 16 to VTS C and composite linker 320 assigned a reconciled value of 14 to VTS C, pattern compiler 204 assigned a value of 2 to SDS X and composite linker 320 assigned a reconciled value of 1 to SDS X, and pattern compiler 204 assigned a value of 3 to SDS Z and composite linker 320 assigned a reconciled value of 3 to SDS Z.

Persons skilled in the art will understand that, when generating composite object 300, composite linker 320 may be configured to step through the various pattern objects of group of pattern objects 370 in any order, and the order in which composite linker 320 steps through the pattern objects in no way limits the scope of the present invention.

In one embodiment, each of first remap table 312, second remap table 314 and third remap table 316 is configured such that all remapping information may be stored at elementary CPU boundaries to enable a CPU to quickly access the remapping information during the loading process.

Figure 4:
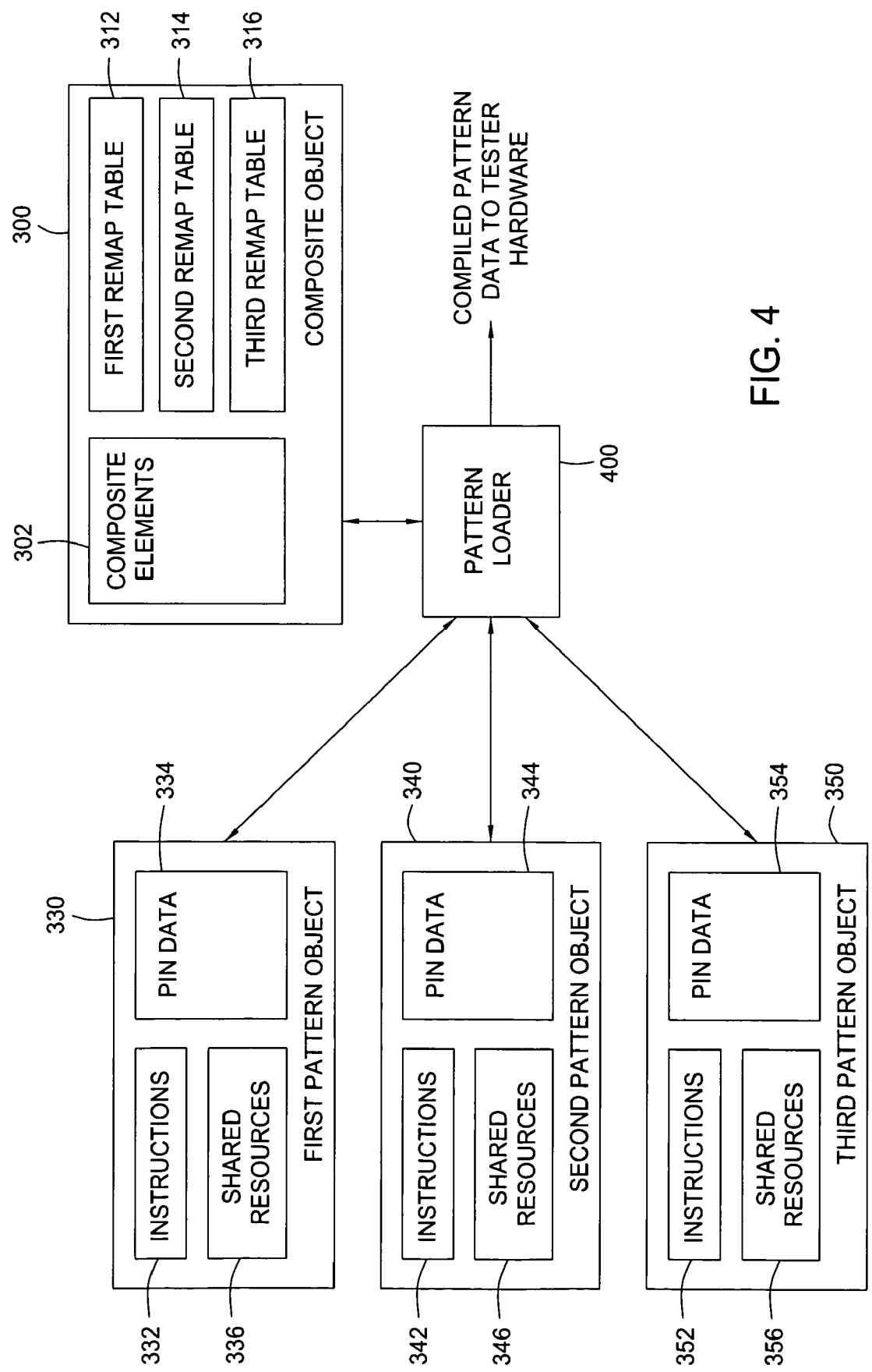
FIG. 4 is a conceptual block diagram illustrating a pattern loader configured to load linked compiled pattern data into tester hardware using the composite object of FIG. 3, according to one embodiment of the invention.

FIG. 4 is a conceptual block diagram illustrating a pattern loader 400 configured to load linked compiled pattern data into tester hardware using composite object 300 of FIG. 3, according to one embodiment of the invention. As shown, pattern loader 400 is configured to load composite load image 302, which contains the binary representations of and reconciled values and address for the unique shared resources residing in each pattern object of group of pattern objects 370, and the pin data and instructions in each pattern object of group of pattern objects 370 into tester hardware 104 of FIG. 1. Notably, when loading the instructions contained in a given pattern object, pattern loader 400 is configured to use the remap table in composite load image 300 corresponding to that pattern object to modify all references (e.g., calls or pointers) to any shared resources in those instructions to reflect the reconciled values and addresses that composite linker 320 assigned to those shared resources. Thus, when loading first pattern object 330, pattern loader 400 loads pin data 334 and loads instructions 332, using the mappings in first remap table 312 to modify all references to any of shared resources 336 in instructions 332 to reflect only reconciled values and addresses. Similarly, when loading second pattern object 340, pattern loader 400 loads pin data 344 and loads instructions 342, using the mappings in second remap table 314 to modify all references to any of shared resources 346 in instructions 342 to reflect only reconciled values and addresses. Again, when loading third pattern object 350, pattern loader 400 loads pin data 354 and loads instructions 352, using the mappings in third remap table 316 to modify all references to any of shared resources 356 included in instructions 352 to reflect only reconciled values and addresses. As persons skilled in the art will understand, through this remapping process, tester hardware 104 receives only compiled pattern data with reconciled values and addresses, enabling tester hardware 104 to receive pattern data from each pattern object of group of pattern objects 370 that has no overlapping or conflicting values or addresses.

Persons skilled in the art will understand that pattern loader 400 may be configured to load composite load image 302 and the pin data and instructions in each pattern object of group of pattern objects 370 in any order, and any such order in no way limits the scope of the present invention.

In an alternative embodiment, pattern loader 400 may be configured to load each shared resource into tester hardware 104 directly from each pattern object of group of pattern objects 370, as opposed to loading the shared resources by loading composite load image 302. In such an embodiment, when loading a particular pattern object, pattern loader 400 may be configured to use the mappings in the remap table corresponding to that pattern object to change the value or address of each shared resource in the pattern object from the compiled value or address (assigned by pattern compiler 204) to the reconciled value or address (assigned by composite linker 320). Persons skilled in the art will understand that, in such an embodiment, pattern loader 400 may be configured to load each unique shared resource only once into tester hardware 104.

Figure 5:
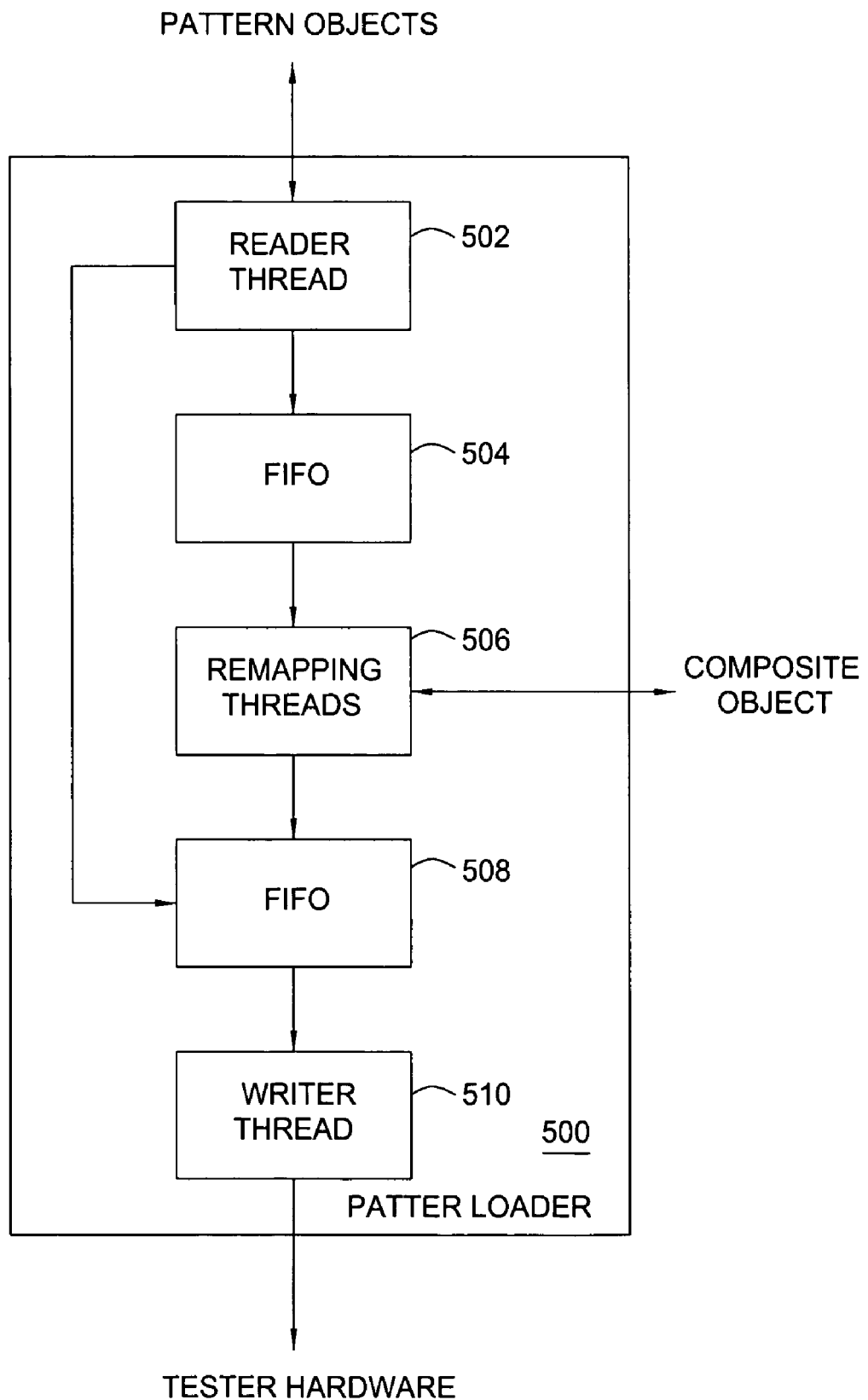
FIG. 5 is a conceptual block diagram illustrating a pattern loader, according to an alternative embodiment of the invention.

FIG. 5 is a conceptual block diagram illustrating a pattern loader 500, according to an alternative embodiment of the invention. As shown, pattern loader 500 is configured as a multi-threaded pattern loader and includes, without limitation, a reader thread 502, a FIFO 504, remapping threads 506, a FIFO 508 and a writer thread 510. Reader thread 502 is configured to read blocks of pin data and instructions from the different pattern objects (i.e., first pattern object 330, second pattern object 340 and third pattern object 350) of group of pattern objects 370. For a given block of pin data and instructions, reader thread 502 is further configured to transmit any pin data included in that block to FIFO 508 and to transmit any instructions included in that block to FIFO 504. In alternative embodiments, more than one thread may be used to perform the reading operations described herein.

Remapping threads 506 are configured to retrieve the instructions from FIFO 504 and to modify any references to any shared resources included in those instructions using the mappings in first remap table 312, second remap table 314 and third remap table 316 (in composite object 300), as the case may be, as previously described herein. Remapping threads 506 are configured then to transmit the modified instructions, with any references reflecting only reconciled values and addresses, to FIFO 508.

In one embodiment, remapping threads 506 include a different thread for each type of shared resource included in composite load image 302. Thus, in the example of FIG. 3, remapping threads 506 include three different threads. The first thread performs all remapping operations with respect to any instruction referring to any of the subroutines contained in composite load image 302, the second thread performs all remapping operations with respect to any instruction referring to any of the VTSs contained in composite load image 302, and the third thread performs all remapping operations with respect to any instruction referring to any of the SDSs in composite load image 302. In alternative embodiments, remapping threads 506 may include any number of threads allocated among the different types of shared resources included in composite object 300 in any fashion.

Writer thread 510 is configured to retrieve the pin data and modified instructions from FIFO 508 and to transmit that the pin data and modified instructions to the tester hardware (i.e., tester hardware 104). In alternative embodiments, more than one thread may be used to perform the writing operations described herein.

The operations performed by reader thread 502, remapping threads 506 and writer thread 510 may be timed such that the remapping operations performed by remapping threads 506 occur in parallel to the reading operations performed by reader thread 502 and writing operations performed by writer thread 510. Further, pattern loader 500 may be configured to perform remapping operations at the same rate or more quickly than reading and writing operations if (i) an appropriate number of remapping threads 506 are used, (ii) pattern compiler 204 is configured to place the shared resources within a pattern object at elementary CPU boundaries, as previously described herein, and (iii) each remap table in composite object 300 is configured such that all remapping information is stored at elementary CPU boundaries, as previously described herein. Thus, depending on thread overhead pattern loader 500, as well as the pattern objects and remap tables, may be configured such that the loading process described herein, including remapping, takes no more time than the loading process of conventional compiling and loading techniques used for patterns.

Figure 6:
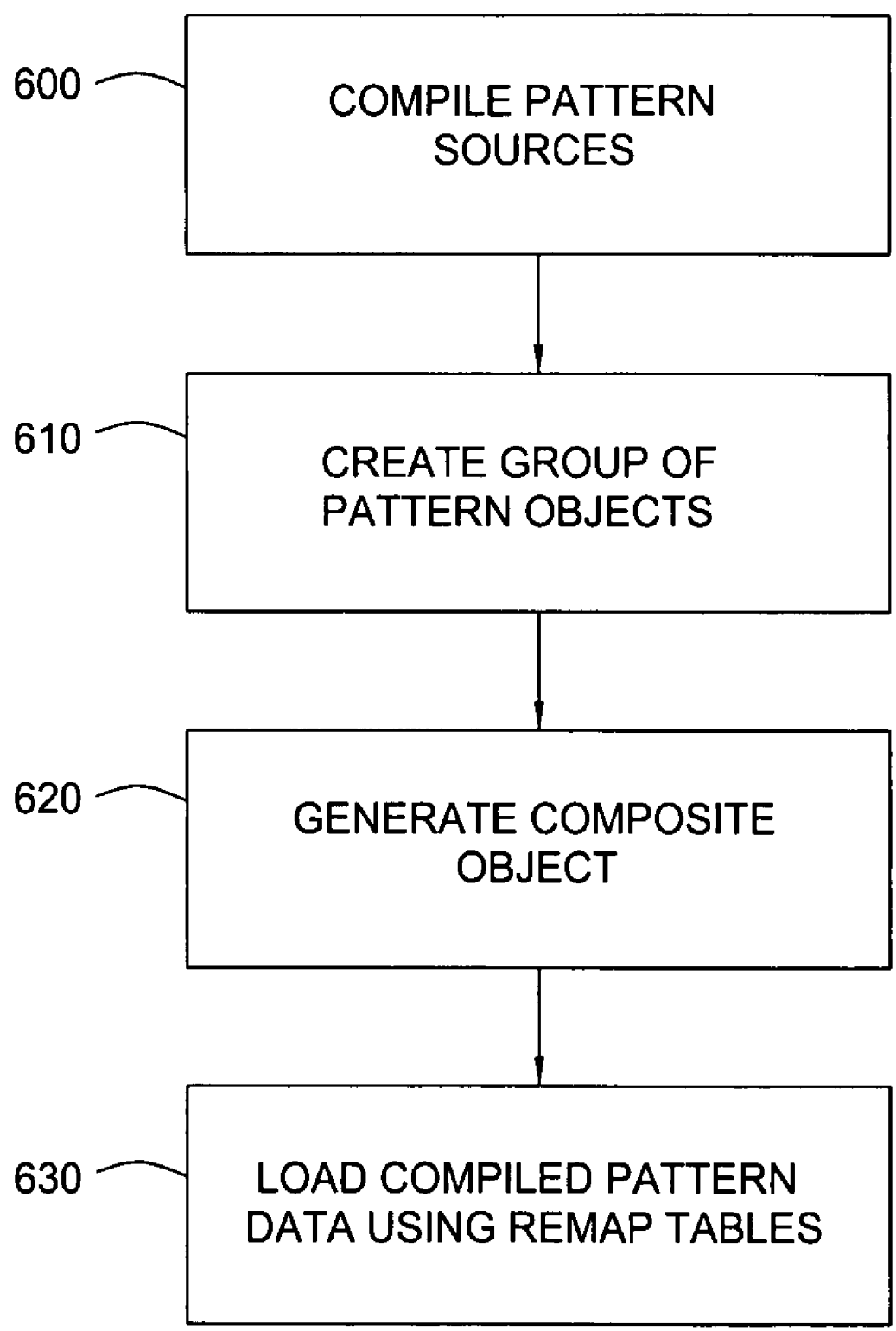
FIG. 6 is a flow chart of method steps for linking and loading compiled pattern data, including shared resources, according to one embodiment of the invention.

FIG. 6 is a flow chart of method steps for linking and loading compiled pattern data, including shared resources, according to one embodiment of the invention. Although the method steps are described in the context of the systems illustrated in FIGS. 1–5, any system configured to perform the method steps in any order is within the scope of the invention.

As shown in FIG. 6, the method of linking and loading starts in step 600 where pattern compiler 204 compiles two or more pattern sources individually. As described above in conjunction with FIG. 2, pattern compiler 204 generates a pattern object for each such pattern source. In step 610, two or more pattern objects are assigned to a group, creating a group of pattern objects, such as group of pattern objects 370, which is to be loaded into tester hardware, such as tester hardware 104.

In step 620, composite linker 320 generates a composite object, such as composite object 300, for the group of pattern objects. As described above in conjunction with FIG. 3, composite object 300 includes, without limitation, a composite load image, such as composite load image 302, and a group of remap tables, such as group of remap tables 304.

The composite load image includes a binary representation of each unique shared resource in the group of pattern objects as well as a reconciled value or address for each such shared resource. In generating the composite load image, pattern linker 320 steps through each pattern object in the group of pattern objects to identify each unique shared resource and the value or address assigned to that shared resource by pattern compiler 204. Pattern linker 320 writes a binary representation of each unique shared resource to the composite load image and assigns a new, reconciled value or address to each such shared resource such that none of the values or addresses of any of the unique shared resources conflicts or overlaps with one another.

The group of remap tables includes a remap table for each pattern object in the group of pattern objects. A given remap table contains a mapping of the values or addresses that pattern compiler 204 assigned to the shared resources included in the pattern object corresponding to that remap table to the reconciled values or addresses that composite linker 320 assigned to those shared resources, as reflected in the composite load image. Thus, as composite linker 320 steps through a particular pattern object in the group of pattern objects, composite linker 320 generates a remap table for that pattern object that specifies for each shared resource in the pattern object the mapping of the value or address that pattern compiler 204 assigned to the shared resource to the value or address that composite linker 320 assigned to the shared resource.

Persons skilled in the art will understand that if composite linker 320 determines that a particular shared resource is unique, meaning that composite linker 320 has not yet encountered that shared resource while stepping through the pattern objects of the group of pattern objects, then composite linker 320 includes the shared resource and its new, reconciled value or address in the composite load image as well as a remapping of the value or address of the shared resource in the appropriate remap table. However, if composite linker 320 determines that a particular shared resource is not unique, meaning that composite linker 320 has already encountered that shared resource and included it and its new, reconciled address in the composite load image, then composite linker 320 only includes a remapping of the value or address of the shared resource in the appropriate remap table.

In step 630, pattern loader 400 loads the pattern data of each pattern object in the group of pattern objects into the tester hardware. In one embodiment, when loading the pattern data, pattern loader 400 loads the composite image containing the binary representations of and the reconciled values or addresses for the unique shared resources residing in the group of pattern objects into the tester hardware. Pattern loader 400 also loads the pin data and instructions contained in each pattern object of the group of pattern objects into the tester hardware. When loading the instructions contained in a given pattern object, pattern loader 400 uses the mappings in the remap table in the composite object corresponding to that pattern object to modify all references (e.g., calls or pointers) to any shared resources in the instructions to reflect the reconciled values and addresses that composite linker 320 assigned to those shared resources.

As persons skilled in the art will understand, through this loading and remapping process, the tester hardware receives only compiled pattern data with reconciled values and addresses, enabling the tester hardware to receive pattern data from each pattern object of the group of pattern objects that has no overlapping or conflicting values or addresses.

In some cases, limitations of the tester hardware may prevent one or more types of shared resources from being properly loaded into the instruments of the tester hardware as set forth above. For example, the instruments (e.g., instruments 110 of FIG. 1) may be configured such that, in one mode, they have the capacity to handle only 4,096 different VTSs, and, in another mode, they have the capacity to handle only 512 different VTSs. Since the number of unique VTSs in a group of pattern objects may exceed 65,000, sometimes all of the VTSs necessary to test a DUT cannot be loaded into the tester hardware at the same time using the systems and methods previously described. In such cases, the systems and methods of FIGS. 1–6 may be modified to overcome the loading limitations of the tester hardware.

FIG. 7 is a conceptual mapping 700 of the different VTSs in VTS load element 308 of FIG. 3 to the instruments of the tester hardware, according to an alternative embodiment of the invention. In this example, the tester hardware is assumed to have four instruments. As shown, mapping 700 includes a global VTS listing 702 and an instrument listing 704. Global VTS listing 702 includes each VTS contained in VTS load element 308, and instrument listing 704 includes each of the four instruments used to test the DUT.

As also shown, mapping 700 sets forth the "local" VTS for each instrument in instrument listing 704 associated with each VTS in global VTS listing 702. Each such local VTS represents the signal sequence across a particular instrument associated with a given VTS in global VTS listing 702. For example, VTS A1 reflects the signal sequence across Instrument 1 associated with VTS A, and VTS B3 reflects the signal sequence across Instrument 3 associated with VTS C. From mapping 700, one can determine the signal sequence across each instrument in instrument listing 704 associated with a given VTS in global VTS listing 702.

Once mapping 700 is complete, the instruments of instrument list 704 may be separately analyzed to determine the number of unique local VTSs there are for each instrument resulting from the VTSs of global VTS listing 702. The number of unique local VTSs also indicates the number of unique signal sequences across each instrument that are associated with the VTSs of global VTS listing 702. For example, VTS A1, VTS B1 and VTS C1 are the three unique local VTSs for Instrument 1, and VTS A3, VTS B3 and VTS C3 are the three unique local VTSs for Instrument 3. This means that there are three unique signal sequences across each of Instrument 1 and Instrument 3 associated with VTS A, VTS B, VTS C and VTS D. Importantly, in the example of Instrument 1, VTS A and VTS B both result in the same signal sequence across the pins of Instrument 1. This common signal sequence may therefore be represented by the same local VTS, VTS A1. Similarly, in the example of Instrument 3, VTS B and VTS C both result in the same signal sequence across Instrument 3. This common signal sequence may therefore be represented by the same local VTS, VTS B3.

After determining the number of unique local VTSs for each instrument, composite linker 320 is configured to create a set of remap tables for the instruments in instrument listing 704. The set of remap tables includes a separate remap table for each instrument in instrument listing 704. In one embodiment, composite linker 320 is configured to create a separate set of remap tables for each instrument for each pattern object in the group of pattern objects. In alternative embodiments, composite linker 320 may be configured to create one or more sets of remap tables for each instrument for the overall group of pattern objects. As described in further detail below, these additional remap tables are used to reduce the amount of information loaded into each of the instruments in the tester hardware by pattern loader 400.

Figure 8:
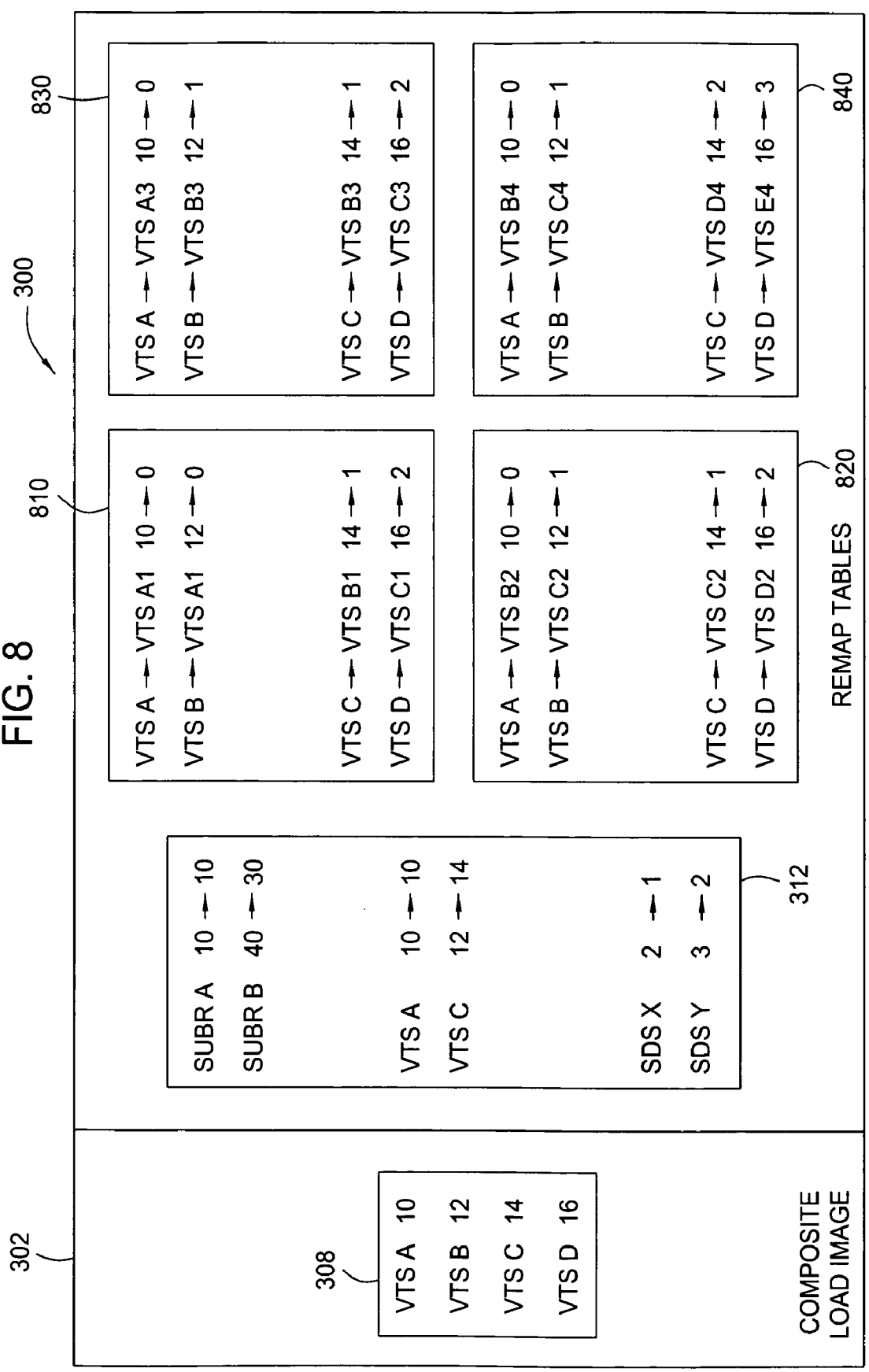
FIG. 8 is a conceptual block diagram illustrating the composite object of FIG. 3, according to an alternative embodiment of the invention.

FIG. 8 is a conceptual block diagram illustrating composite object 300 of FIG. 3, according to an alternative embodiment of the invention. As shown, composite object 300 includes, without limitation, VTS load element 308, remap table 312 and remap tables 810, 820, 830 and 840. As previously mentioned, each of remap tables 810, 820, 830 and 840 corresponds to a different instrument in instrument listing 704. In this example, remap table 810 corresponds to Instrument 1, remap table 820 corresponds to Instrument 2, remap table 830 corresponds to Instrument 3 and remap table 840 corresponds to Instrument 4.

When generating a remap table for a particular instrument, composite linker 320 is configured to assign a reconciled value to each unique local VTS that composite linker 320 identifies for that instrument. These per-instrument reconciled values are hereinafter referred to as "local" reconciled values. For example, as remap table 810 shows, composite linker 320 assigned a local reconciled value of 0 to VTS A1, a local reconciled value of 1 to VTS B1 and a reconciled value of 2 to VTS C1. Further, for every VTS in VTS load element 308 (i.e., every VTS in global VTS listing 702), composite linker 320 is configured (i) to map the VTS to the corresponding local VTS (associated with the VTS) for the particular instrument, and (ii) to remap the reconciled value assigned to the VTS to the local reconciled value assigned to the corresponding local VTS (associated with the VTS) for the particular instrument. For example, as remap table 810 shows, VTS A is mapped to VTS A1 (the local VTS for Instrument 1 associated with VTS A in FIG. 7). Further, the reconciled value assigned to VTS A, 10, is remapped to the local reconciled value assigned to VTS A1, 0. Similarly, as remap table 830 shows, VTS C is mapped to VTS B3 (the local VTS for instrument 3 associated with VTS C in FIG. 7). Further, the reconciled value assigned to VTS C, 14, is remapped to the local reconciled value assigned to VTS B3, 1. In one embodiment, the mapping of the VTSs to the local VTSs contained in the remap tables includes the binary representations of both the VTSs and the local VTSs. In alternative embodiments, the remap tables may include the binary representations of only the local VTSs.

Using remap tables 810, 820, 830 and 840, pattern loader 400 is able to load the VTS-related information contained in the different pattern objects of the group of pattern objects into the tester hardware on an instrument-by-instrument basis. More specifically, for a given instrument, pattern loader 400 is configured to load the binary representation of each unique local VTS for that instrument into the data store memory of the instrument as well as the local reconciled value corresponding to each such unique local VTS. For example, pattern loader 400 uses remap table 810 to load the binary representations of VTS A1, VTS B1 and VTS C1 into the data store memory of Instrument 1 as well as the local reconciled values corresponding to those unique local VTSs, 0, 1 and 2, respectively. Similarly, pattern loader 400 uses remap table 830 to load the binary representations of VTS A3, VTS B3 and VTS C3 into the data store memory of Instrument 3 as well as the local reconciled values corresponding to those unique local VTSs, 0, 1 and 2, respectively.

In addition, pattern loader 400 is configured to load the instructions contained in each pattern object of the group of pattern objects into each instrument in instrument listing 704 such that each instrument receives a complete set of instructions. As set forth above in conjunction with FIG. 4, when loading instructions into a particular instrument, pattern loader 400 is configured first to use the remap tables corresponding to the different pattern objects (e.g., remap tables 312, 314 and 316) to modify all references to any of the VTSs in those instructions to reflect the reconciled values assigned to the VTSs by composite linker 320. Pattern loader 400 is configured then to use the remap table corresponding to the particular instrument to change all references to the VTSs in the instructions from the reconciled values to the local reconciled values assigned to the local VTSs for that instrument by composite linker 320. This step ensures that the instructions loaded into a given instrument contain proper references to the local VTSs that are loaded into the instruments by pattern loader 400.

For example, when loading the instructions into Instrument 1 contained in pattern object 330, pattern loader 400 first uses remap table 312 to change all references to VTS A from 10 to 10 and VTS C from 12 to 14 (as described above in conjunction with FIG. 4). Then, pattern loader 400 uses remap table 810 to change all references to VTS A in the instructions from the reconciled value of 10 to the local reconciled value of 0, corresponding to VTS A1, and all references to VTS C in the instructions from the reconciled value of 14 to the local reconciled value of 1, corresponding to VTS B1. Similarly, when loading instructions into Instrument 3 contained in pattern object 330, pattern loader first uses remap table 312 to change all references to VTS A from 10 to 10 and VTS C from 12 to 14. Then, pattern loader 400 uses remap table 830 to change all references to VTS A in the instructions from the reconciled value of 10 to the local reconciled value of 0, corresponding to VTS A3, and all references to VTS C in the instructions from the reconciled value of 14 to the local reconciled value 1, corresponding to VTS B3.

The foregoing demonstrates how remapping the shared resources on an instrument-by-instrument basis may reduce the amount of information loaded into the data store memory of a particular instrument. As previously described, if the same signal sequence across a given instrument results from two different VTSs, then the binary representation of only one local VTS (reflecting that particular signal sequence) has to be loaded into the data store memory of that instrument. Similarly, if the same signal sequence across a given instrument results from three, four or even a thousand different VTSs, then the binary representation of only one local VTS (again, reflecting that particular signal sequence) has to be loaded into the data store memory of that instrument. As set forth above, the instructions contained in the pattern objects may be modified using an instrument-specific remap table to ensure that the instructions, when loaded into the instrument, properly reference the local VTS loaded into the instrument.

The following example further demonstrates how remapping shared resources on an instrument-by-instrument basis may reduce the amount of information that must be loaded into the tester hardware instruments. Assume that the tester hardware has four, four-pin instruments and that the DUT has sixteen pins. Over 65,000 unique signal combinations may exist across the pins of the DUT (i.e., across the pins of the four instruments). However, a maximum of only sixteen unique signal combinations may exist across the pins of a given instrument. Thus, by dividing the signal combinations on an instrument-by-instrument basis, a maximum of only sixteen signal combinations may need to be loaded into each instrument, as opposed to the more than 65,000 signal combinations that may need to be loaded into each instrument if the signal combinations are not so divided.

Figure 9:
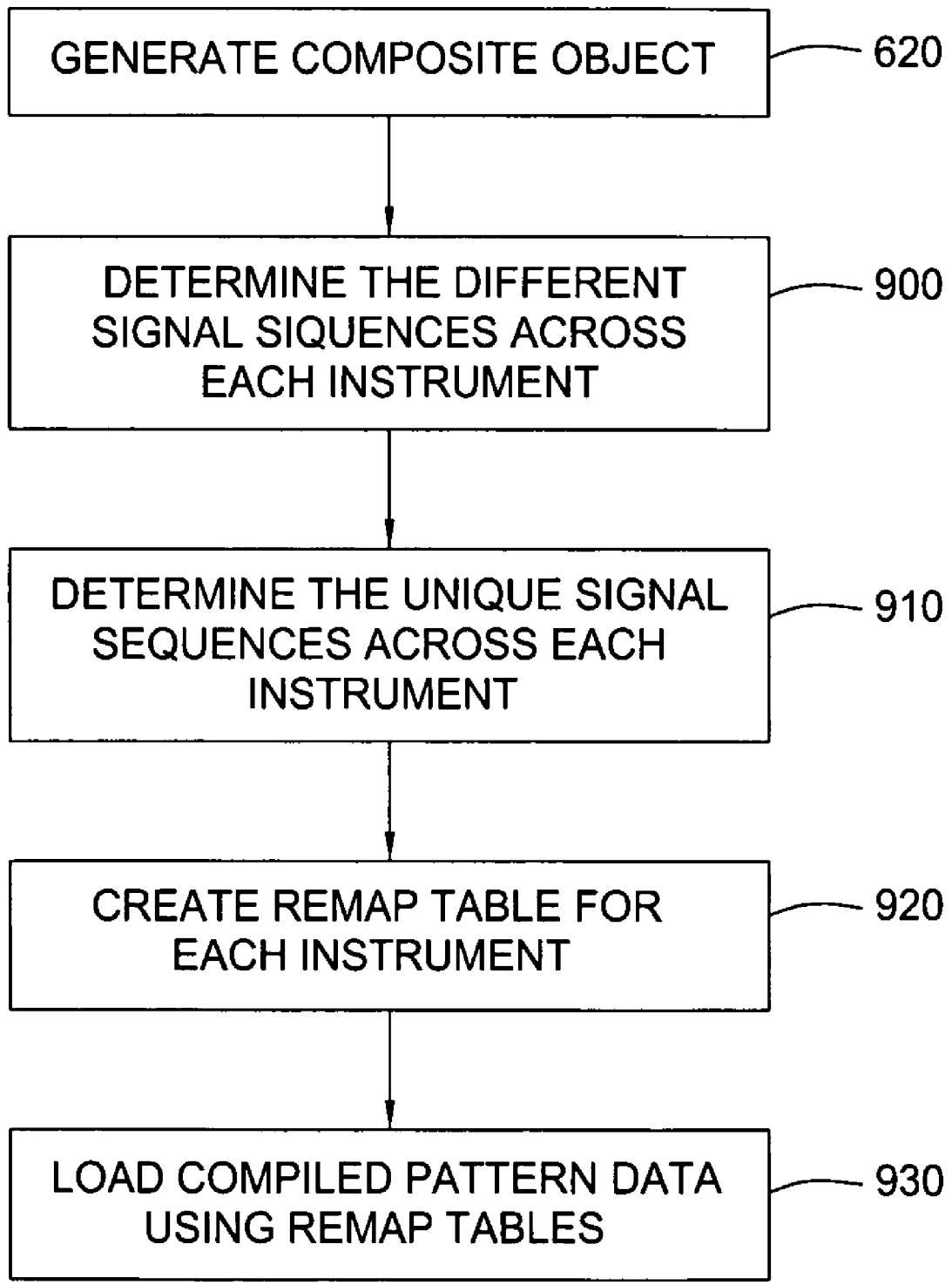
FIG. 9 is a flow chart of method steps for linking and loading compiled pattern data, including shared resources, according to an alternative embodiment of the invention.

FIG. 9 is a flow chart of method steps for linking and loading compiled pattern data, including shared resources, according to an alternative embodiment of the invention. Although the method steps are described in the context of the systems illustrated in FIGS. 1–8, any system configured to perform the method steps in any order is within the scope of the invention.

As shown in FIG. 9, the alternative method of linking and loading starts at step 620 of FIG. 6 where composite linker 320 generates a composite object, such as composite object 300, for a group of pattern objects. The composite object includes a VTS load element, such as VTS load element 308, and a remap table for each pattern object in the group of pattern objects, such as remap table 312.

In step 900, composite linker 320 determines the different signal sequences across each instrument in the tester hardware. As described above in conjunction with FIG. 7, composite linker 320 maps each VTS in VTS load element 308 (represented in global VTS listing 702) across the different instruments in the tester hardware (represented in instrument listing 704) to determine the local VTS for each instrument associated with each VTS. This mapping (represented by mapping 700) allows composite linker 320 to analyze what local VTS results from each VTS for each instrument. Referring back to FIG. 7, each local VTS in mapping 700 represents a specific signal combination across an instrument associated with a specific VTS. Thus, for example, VTS A results in a signal combination across Instrument 2 represented by local VTS, VTS B2, and VTS C results in a signal combination across Instrument 3 represented by local VTS, VTS B3. In step 910, composite linker 320 determines how many unique local VTSs exist for each instrument in the tester hardware. Again, referring back to FIG. 7, Instrument 1 has three unique local VTSs, VTS A1, VTS B1 and VTS C1, and Instrument 3 also has three unique local VTSs, VTS A3, VTS B3 and VTS C3.

In step 920, composite linker 320 creates a remap table for each instrument in the tester hardware. When generating a remap table for a particular instrument, composite linker 320 is configured to assign a local reconciled value to each unique local VTS that composite linker 320 identifies for that instrument. Then, for every VTS in VTS load element 308, composite linker 320 (i) maps the VTS to the corresponding local VTS (associated with the VTS) for the particular instrument, and (ii) remaps the reconciled value assigned to the VTS to the local reconciled value assigned to the corresponding local VTS (associated with the VTS) for the particular instrument.

In step 930, pattern loader 400 loads the pattern data of each of the pattern objects in the group of pattern objects into the tester hardware. This step is similar to step 630 of FIG. 6, except that pattern loader 400 uses the remap tables specific to each instrument of the tester hardware to load the VTS-related information on an instrument-by-instrument basis. More specifically, for a given instrument, pattern loader 400 loads (i) the binary representation of each unique local VTS for that instrument and (ii) the local reconciled value corresponding to each such unique local VTS into the data store memory of the instrument. In addition, pattern loader 400 loads the instructions contained in each pattern object of the group of pattern objects into each instrument of the tester hardware. The result is that each instrument receives a complete set of instructions.

When loading instructions into a particular instrument, pattern loader 400 first uses the remap tables corresponding to the different pattern objects to modify all references to any of the VTSs in those instructions to reflect the reconciled values assigned to the VTSs by composite linker 320. Pattern loader 400 then uses the remap table corresponding to the particular instrument to change all references to the VTSs in the instructions from the reconciled values to the local reconciled values assigned to the local VTSs for that instrument by composite linker 320. This step ensures that the instructions loaded into a given instrument contain proper references to the local VTSs that are loaded into the instruments by pattern loader 400.

Although the example set forth in FIGS. 7–9 pertains to VTSs, the approach of remapping shared resources contained in composite object 300 on an instrument-by-instrument basis to reduce the amount of information to be loaded into each instrument may be applied to any type of shared resource.

One advantage of the systems and methods described above is that, among other things, composite linker 320 may be configured to perform the method steps to reconcile the values or addresses of shared resources included in group of pattern objects 370 such that tester hardware 104 does not receive any conflicting values or addresses when group of pattern objects 370 is loaded into tester hardware 104. Having composite linker 320 perform the reconciliation task using pattern objects, as opposed to having pattern compiler 204 perform the reconciliation task using pattern sources, enables the pattern sources to be independently compiled to generate the pattern objects, which may then be individually archived as read-only files. This capability allows new groups of patterns to be created, linked and loaded into the tester hardware without having to recompile any pattern sources. Similarly, a given pattern source may be modified and recompiled without having to recompile every group of patterns containing that pattern source. In addition, since pattern compiler 204 independently compiles the various pattern sources and the resulting pattern objects may be stored as read-only files, more than one processor or computer may be used to compile the pattern sources. Such a distributed method of pattern source compilation is an efficient way to generate an archive of pattern objects.

Another advantage of the systems and methods described above is that shared resources may be remapped on an instrument-by-instrument basis to overcome loading limitations that may exist in the tester hardware.

The invention has been described above with reference to specific embodiments. Persons skilled in the art, however, will understand that various modifications and changes may be made thereto without departing from the broader spirit and scope of the invention as set forth in the appended claims.

For example, if the number of unique shared resources in group of pattern objects 370 is too large for a single composite load image 302, composite linker 320 may be configured to generate more than one composite load image 302 in composite object 300 or to generate multiple composite objects 300 that are linked together. Further, composite linker 320 and/or pattern loaders 400 and 500 may be configured in a distributed fashion such that multiple processors or computers may be used to perform the composite linking steps and/or loading steps described herein. Also, composite linker 320 may be configured simply to update composite object 300 to reflect any additional resource allocations necessary to accommodate an additional pattern object being added group of pattern objects 370 or a modification of one of the pattern objects in group of pattern objects 370 instead of re-linking the pattern objects of group of pattern objects 370 in each such case. In addition, given enough processing power, all or part of the composite linking steps described herein may be performed during the loading process, and/or pattern compiler 204 may be configured to perform the composite linking steps or to update composite object 300 when adding a pattern object to group of pattern objects 370 or when modifying one or more of the pattern objects of group of pattern objects 370, as previously described herein.

The foregoing description and drawings are, accordingly, to be regarded in an illustrative rather than a restrictive sense.

What is claimed is:

1. A method of linking and loading compiled pattern data, the method comprising:
   generating a composite object that includes a shared resource;
   determining a local shared resource specific to a test instrument that is associated with the shared resource in the composite object;
   assigning a local reconciled value or address to the local shared resource;
   loading the local shared resource into the test instrument;
   loading the local reconciled value or address into the test instrument; and
   generating a remap table corresponding to the test instrument,
   wherein the remap table contains a remapping of a reconciled value or address associated with the shared resource and included in the composite object to the local reconciled value or address associated with the local shared resource.

2. The method of claim 1, wherein the shared resource is a vector type select and the local shared resource is a local vector type select.

3. The method of claim 1, wherein loading the local shared resource into the test instrument includes loading a binary representation of the local shared resource into the test instrument.

4. The method of claim 1, wherein the remap table contains a mapping of the shared resource to the local shared resource.

5. The method of claim 1, further comprising the step of loading instructions into the test instrument that contain a reference to the shared resource, wherein the reference is modified to reflect the reconciled value or address associated with the shared resource and included in the composite object.

6. The method of claim 5, further comprising the step of changing the reconciled value or address reflected in the instructions to the local reconciled value or address associated with the local shared resource.

7. A computer-readable medium storing instructions for causing one or more processors to load and link compiled pattern data by performing the steps of:
   generating a composite object that includes a shared resource;
   determining a local shared resource specific to a test instrument that is associated with the shared resource in the composite object;
   assigning a local reconciled value or address to the local shared resource;
   loading the local shared resource into the test instrument;
   loading the local reconciled value or address into the test instrument; and
   generating a reman table corresponding to the test instrument, wherein the reman table contains a remapping of a reconciled value or address associated with the shared resource and included in the composite object to the local reconciled value or address associated with the local shared resource.

8. The computer-readable medium of claim 7, wherein the shared resource is a vector type select and the local shared resource is a local vector type select.

9. The computer-readable medium of claim 7, wherein loading the local shared resource into the test instrument includes loading a binary representation of the local shared resource into the test instrument.

10. The computer-readable medium of claim 7, wherein the remap table contains a mapping of the shared resource to the local shared resource.

11. The computer-readable medium of claim 7, further comprising the step of loading instructions into the test instrument that contain a reference to the shared resource, wherein the reference is modified to reflect the reconciled value or address associated with the shared resource and included in the composite object.

12. The computer-readable medium of claim 11, further comprising the step of changing the reconciled value or address reflected in the instructions to the local reconciled value or address associated with the local shared resource.

13. A system for loading and linking compiled pattern data, the system comprising:
   a tester having a test instrument; and
   one or more processors configured to perform the steps of:
      generating a composite object that includes a shared resource,
      determining a local shared resource specific to the test instrument that is associated with the shared resource in the composite object,
      assigning a local reconciled value or address to the local shared resource, and
      loading the local shared resource into the test instrument,
   wherein the one or more processors are further configured to perform the step of generating a remap table corresponding to the test instrument, wherein the remap table contains a remapping of a reconciled value or address associated with the shared resource and included in the composite object to the local reconciled value or address associated with the local shared resource.

14. The system of claim 13, wherein the one or more processors are further configured to perform the step of loading the local reconciled value or address into the test instrument.

15. The system of claim 13, wherein the one or more processors are further configured to perform the steps of loading instructions into the instrument that contain a reference to the shared resource, wherein the reference is modified to reflect the reconciled value or address associated with the shared resource and included in the composite object, and changing the reconciled value or address reflected in the instructions to the local reconciled value or address associated with the local shared resource.

* * * * *